US007694414B2

(12) United States Patent
Maeda et al.

(10) Patent No.: US 7,694,414 B2
(45) Date of Patent: Apr. 13, 2010

(54) METHOD OF MANUFACTURING MULTILAYERED ELECTRONIC COMPONENT

(75) Inventors: Tomoyuki Maeda, Yokaichi (JP); Hideaki Matsushima, Echi-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 10 days.

(21) Appl. No.: 12/099,213

(22) Filed: Apr. 8, 2008

(65) Prior Publication Data

US 2008/0250628 A1 Oct. 16, 2008

Related U.S. Application Data

(62) Division of application No. 11/000,281, filed on Nov. 30, 2004, now Pat. No. 7,375,977.

(30) Foreign Application Priority Data

Dec. 5, 2003 (JP) ............................ 2003-407266

(51) Int. Cl.
*H05K 3/30* (2006.01)

(52) U.S. Cl. ............................ 29/832; 29/605; 29/606; 29/609; 361/760; 361/761; 361/762; 361/763; 336/191; 336/200

(58) Field of Classification Search ................ 29/602.1, 29/604–607, 609, 832, 837, 842, 850, 852, 29/854, 592.1; 361/760–766; 336/191–200, 336/29, 65, 83, 233, 234, 602.1, 605, 606, 336/609, 832, 837, 842, 850, 852, 854; 148/108–121
See application file for complete search history.

(56) References Cited

U.S. PATENT DOCUMENTS

| | | | | |
|---|---|---|---|---|
| 6,189,200 | B1 * | 2/2001 | Takeuchi et al. | 29/602.1 |
| 6,218,925 | B1 * | 4/2001 | Iwao | 336/200 |
| 6,580,350 | B1 * | 6/2003 | Kobayashi | 336/200 |
| 2003/0062111 | A1 * | 4/2003 | Moriya | 156/89.12 |

OTHER PUBLICATIONS

Maeda et al.; "Multilayered Electronic Component"; U.S. Appl. No. 11/000,281, filed Nov. 30, 2004.

* cited by examiner

*Primary Examiner*—Paul D Kim
(74) *Attorney, Agent, or Firm*—Keating & Bennett, LLP

(57) ABSTRACT

A multilayered electronic component that is easy to manufacture and that has excellent electrical characteristics includes end portions of coil wiring patterns that oppose a coil connection electrode that is displaced on the surface of a second ceramic layer due to an increase or decrease in the number of first ceramic layers. A coil connection electrode has a shape in which surface portions of second ceramic layers or opposed second ceramic layers having the first ceramic layers disposed in between are connected to the end portions of the coil wiring patterns that oppose the respective coil connection electrode, which are displaced due to the increase or decrease in the number of the first ceramic layers. A connection wiring pattern has a shape in which one portion of a coil connection electrode is connected to one portion of an external extension electrode connection pattern.

10 Claims, 14 Drawing Sheets

METHOD OF MANUFACTURING MULTILAYERED ELECTRONIC COMPONENT

BACKGROUND OF THE INVENTION

1. Field of the Invention

The present invention relates to a multilayered electronic component having a coil conductor formed inside a laminate.

2. Description of the Related Art

An example of conventional multilayered electronic components is shown in FIGS. 13 and 14. This multilayered electronic component 100 is a chip inductor, and a coil conductor 102 is buried inside a laminate 101 having a rectangular parallelepiped shape. The coil conductor 102 includes a coil wiring pattern 104 formed on the surface of a ceramic layer 103 forming the laminate 101, and an electrical conductor (via conductor) 105 arranged on each ceramic layer 103 so as to extend there through in the thickness direction thereof. The coil conductor 102 functions as a coil by electrically connecting the end portions of each coil wiring pattern 104 by an electrical conductor 105.

An external extension of the coil conductor 102 is formed in the following manner. A terminal electrode 106 is provided at both ends of the laminate 101. An external extension electrode 107 is provided between the terminal electrode 106 and the end portion of the coil conductor 102. A plurality of the external extension electrodes 107 are provided, and each external extension electrode 107 is interlayer-connected via the electrical conductor 105 incorporated in the ceramic layer 103. The inner end of the external extension electrode 107 and the coil conductor 102 are electrically connected to each other via a connection wiring pattern 108 and the electrical conductor 105.

The connection wiring pattern 108 is provided on the surface of the ceramic layer 103 that is closest to the group of the ceramic layers on which the coil conductor 102 is formed. The connection wiring pattern 108 has a shape that connects a surface portion of the ceramic layer opposing the end portion of the coil conductor 102 to a surface portion of the ceramic layer opposing the external extension electrode 107.

The coil conductor 102 and the connection wiring pattern 108 are electrically connected to each other via the electrical conductor 105. The external extension electrode 107 and the connection wiring pattern 108 are electrically connected to each other via the electrical conductor 105. The external extension electrode 107 and the terminal electrode 105, which are arranged at the end portions of the laminate 101, are electrically connected to each other as a result of being brought into contact with each other.

In the configuration of the multilayered electronic component of Japanese Unexamined Patent Application Publication No. 11-260644 shown in FIGS. 13 and 14, there is a problem in that a plurality of patterns of the connection wiring pattern 108 are required. In general, the number of windings of the coil is adjusted in accordance with, for example, the required electrical characteristics. The adjustment of the number of windings in this case is performed by increasing or decreasing the number of the ceramic layers 103 on which the coil wiring pattern 104 is formed. When the number of the ceramic layers 103 is increased or decreased, the position at which the end portion of the coil conductor 102 is arranged changes. When the position at which the end portion of the coil conductor 102 is arranged changes, the shape of the connection wiring pattern 108 that connects the coil conductor 102 to the external extension electrode 107 must be changed.

For this reason, in the configuration of Japanese Unexamined Patent Application Publication No. 11-260644, the connection wiring pattern 108 having a shape different for each multilayered electronic component 100 having different characteristics must be formed on the ceramic layer 103. However, in this case, a plurality of form frames (masks) required to form each of the connection wiring patterns 108 become necessary. In that case, when a form frame is replaced, the form frame is cleaned, and the extra conductive paste is discarded. As a result, additional cleaning steps become necessary, and moreover, the amount of conductive paste to be discarded increases, causing the manufacturing cost to be increased correspondingly.

In this case, it is also possible to rotate and use the ceramic layer 103 on which the connection wiring pattern 108 is formed. In that case, since some type of indicator for identifying the direction of the ceramic layer 103 and rotating it becomes additionally necessary, the cost increases.

In the configuration of the known multilayered electronic component disclosed in Japanese Unexamined Patent Application Publication No. 2001-076928, although not shown in FIGS. 13 and 14, the connection wiring pattern 108 having a cross shape that connects together the arrangement positions of the end portions of the coil conductor 102 is formed. For this reason, it is possible to electrically connect each of the displaced end portions of the coil conductor 102 to one connection wiring pattern. However, in this configuration, as a result of the connection wiring pattern being formed in a cross shape, the area where the connection wiring pattern 108 blocks the internal space of the coil conductor 102 increases. This presents the problem that the electrical characteristics (inductance, etc.) of the multilayered electronic component decrease.

SUMMARY OF THE INVENTION

In order to overcome the problems described above, preferred embodiments of the present invention provide a multilayered electronic component that is easy to manufacture and that has excellent electrical characteristics.

According to one preferred embodiment of the present invention, a multilayered electronic component includes a plurality of first ceramic layers that are stacked in an integral manner to define a laminate, a second ceramic layer that is arranged at a desired position in the laminate, a coil wiring pattern that defines a portion of a coil conductor, the coil wiring pattern being provided on the surface of each of the first ceramic layers, an external extension electrode connection pattern provided on a desired surface portion of the second ceramic layer, a coil connection electrode arranged so as to pass through the surface portion of the second ceramic layer opposing an end portion of the coil wiring pattern with the second ceramic layer or the first ceramic layer disposed in between, a connection wiring pattern that is provided on the surface of the second ceramic layer, the connection wiring pattern being arranged to connect together the external extension electrode connection pattern and the coil connection electrode, a first electrical conductor arranged on the first ceramic layer so as to extend therethrough in the thickness direction thereof and arranged to allow opposed end portions of the coil wiring pattern with one of the first ceramic layers disposed therebetween to be electrically connected to each other and to allow the coil wiring patterns to define the coil conductor, and a second electrical conductor that is provided on the second ceramic layer or the first ceramic layer in contact with the second ceramic layer so as to extend therethrough in the thickness direction thereof and that electrically connects the end portions of the coil wiring pattern and the coil connection electrode, which are opposed to each other.

In the multilayered electronic component of a preferred embodiment of the present invention, the end portion of the coil wiring pattern that opposes the coil connection electrode is displaced on the surface of the first ceramic layer due to an increase or decrease in the number of the first ceramic layers. Also, the coil connection electrode has a shape in which a surface portion of the second ceramic layer opposed to the first ceramic layer or the second ceramic layer disposed in between is connected to the end portion of the coil wiring pattern that opposes the coil connection electrode, which is displaced due to an increase or decrease in the number of the first ceramic layers. Further, the connection wiring pattern has a shape in which one portion of the coil connection electrode and one portion of the external extension electrode connection pattern are connected to each other.

In another preferred embodiment of the present invention, a method of manufacturing the above-described multilayered electronic component includes the steps of providing a plurality of first ceramic green layers and forming the first electrical conductor or the second electrical conductor on the first ceramic green layers, forming the coil wiring pattern on the first ceramic green layers, providing a second ceramic green layer and forming the second electrical conductor on the second ceramic green layer, forming the external extension electrode connection pattern, the coil connection electrode, and the connection wiring pattern on the second ceramic green layer, laminating the first and second ceramic green layers in a state in which the second ceramic green layer is inserted at a desired position in the laminate, and calcining the laminate including the first second ceramic green sheets.

In the step of forming the external extension electrode connection pattern, the coil connection electrode, and the connection wiring pattern in the second ceramic green layer, the coil connection electrode is formed to have a configuration in which the second ceramic green layer or a surface portion of the second ceramic green layer opposed to the first ceramic green layer disposed in between is connected to the end portion of the coil wiring pattern that opposes the coil connection electrode, and the connection wiring pattern is formed to have a configuration in which one portion of the coil connection electrode and one portion of the external extension electrode connection pattern are connected to each other.

As a result, in preferred embodiments of the present invention, in spite of the fact that the end portions of the coil wiring patterns that oppose the coil connection electrode are displaced on the surface of the first ceramic layer due to an increase or decrease in the number of the first ceramic layers, it is possible to connect each displacement point of the end portion opposing the coil connection electrode to the coil connection electrode. Therefore, it is possible for the second ceramic layer having one or a few types of coil connection electrodes to handle and cope with the increase or decrease in the number of the first ceramic layers. This leads to a reduction of the types of the second ceramic layers that are required to be provided and makes the step of mounting the second ceramic layers very easy.

In a preferred embodiment of the present invention, the coil connection electrode is arranged along the circulation trace of the coil conductor, when viewed from the circulation centerline direction of the coil conductor. Consequently, the block of the magnetic flux of the coil conductor by the coil connection electrode can be minimized, and the characteristics of the multilayered electronic component are greatly improved.

The coil connection electrode preferably has an annular shape in which one end is separated. This makes it possible to allow the coil connection electrode to function as a part of the coil conductor. This leads to improved characteristics of the multilayered electronic component, and the size of the component can be reduced.

Preferably, the coil connection electrode has a land portion in a surface portion of the second ceramic layer. This makes it possible to improve connection characteristics and to reduce Rdc.

Preferably, the coil conductor is arranged in such a way that the circulation trace when viewed from the circulation centerline direction thereof has a substantially a rectangular shape. Consequently, the area where the magnetic flux passes through can be increased. This leads to improved characteristics of the multilayered electronic component, and the size of the component can be reduced.

Preferably, the end portion of each of the coil wiring patterns is provided in the corner of the coil conductor in which the circulation trace when viewed from the circulation centerline direction of the coil conductor has a substantially rectangular shape. Consequently, the block of the magnetic flux of the coil conductor by the coil connection electrode can be decreased further.

According to various preferred embodiments of the present invention, a multilayered electronic component that is easy to manufacture and that has excellent electrical characteristics is provided.

Other features, elements, steps, characteristics and advantages of the present invention will become more apparent from the following detailed description of preferred embodiments with reference to the attached drawings.

DETAILED DESCRIPTION OF PREFERRED EMBODIMENTS

Preferred embodiments of a multilayered electronic component and a method of manufacturing the same according to the present invention will now be described below with reference to the attached drawings.

Figure 1:
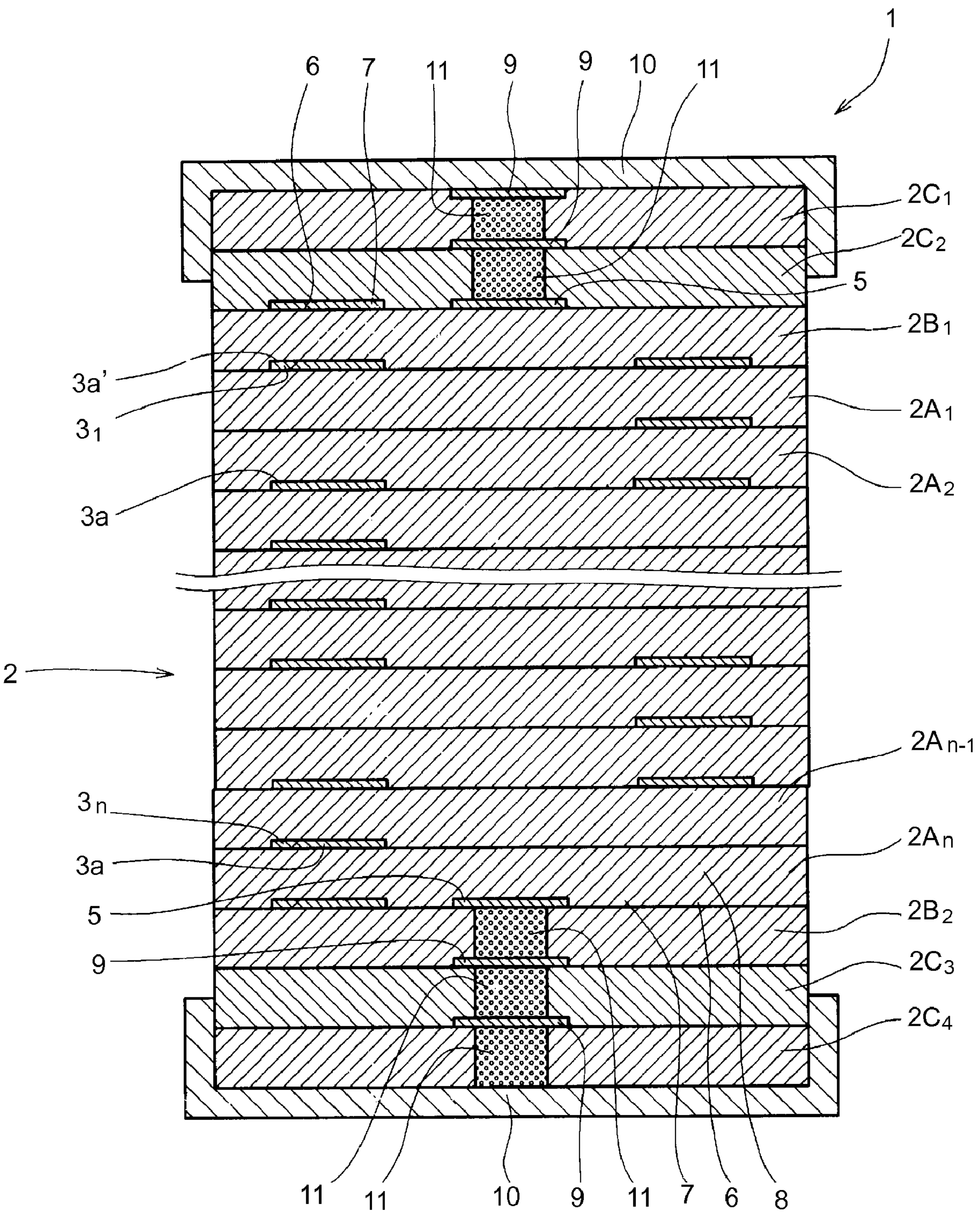
FIG. 1 is a sectional view showing the structure of a multilayered chip inductor according to a preferred embodiment of the present invention.
Figure 2:
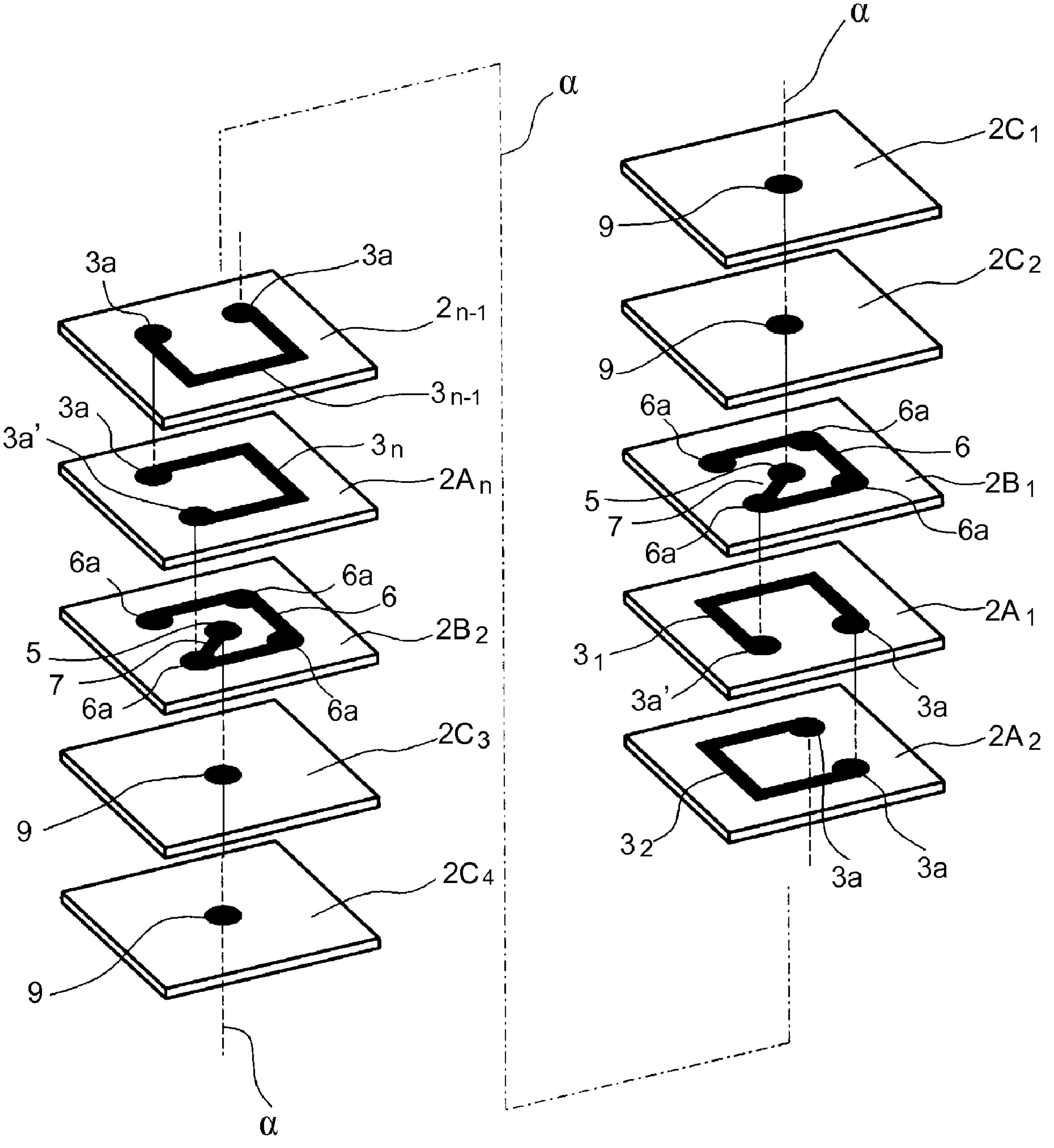
FIG. 2 is an exploded perspective view showing the structure of the multilayered chip inductor according to a preferred embodiment of the present invention.
Figure 4:
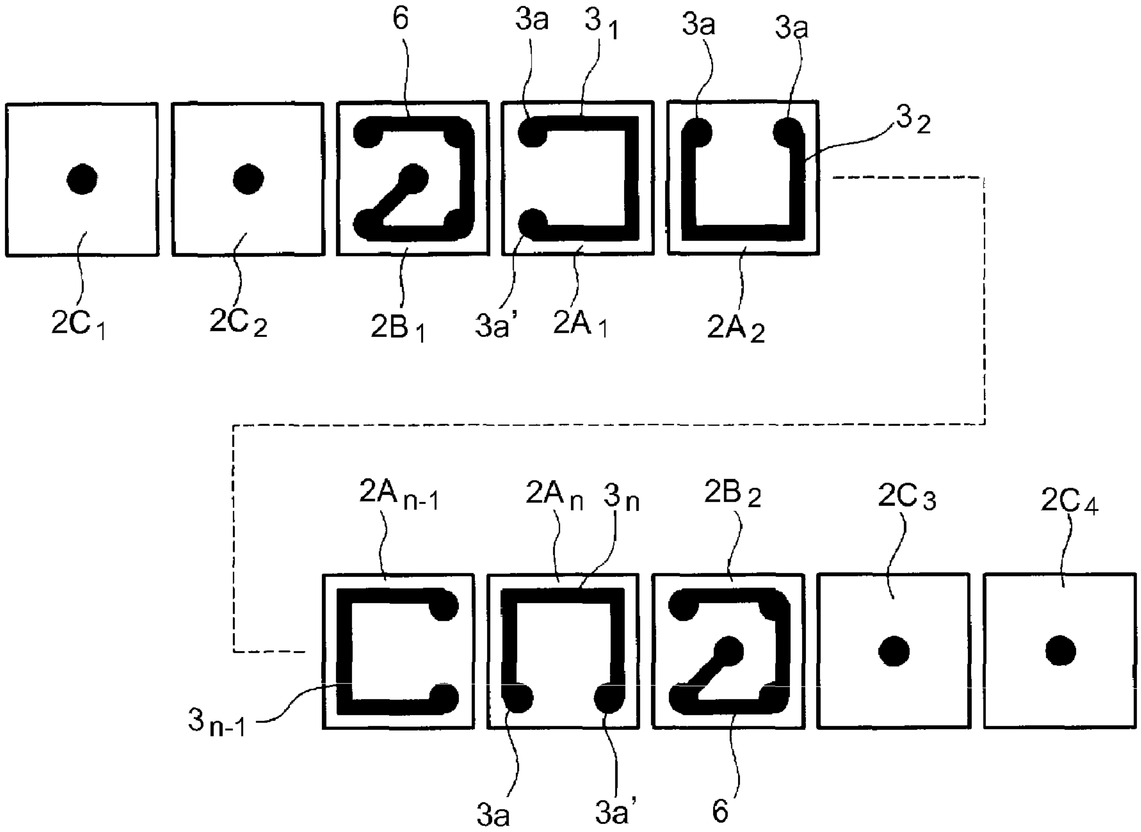
FIG. 4 is a development view showing the structure of the multilayered chip inductor according to a preferred embodiment of the present invention.

In the present preferred embodiment, the present invention relates to a multilayered chip inductor 1. FIG. 1 is a sectional view thereof. FIG. 2 is an exploded perspective view of the main portion thereof. FIG. 4 is a development view of each ceramic layer forming the multilayered chip inductor 1.

The multilayered chip inductor 1 has a plurality of first ceramic layers $2A_{1\ to\ n}$, second ceramic layers $2B_{1\ and\ 2}$, and coated ceramic layers $2C_{1\ to\ 4}$ preferably having a substantially rectangular shape or a substantially square shape. The ceramic layers $2A_{1\ to\ n}$ and $2B_{1\ and\ 2}$ and the coated ceramic layers $2C_{1\ to\ 4}$ are laminated in sequence in an integral manner to form a laminate 2. More specifically, with the multilayered first ceramic layers $2A_{1\ to\ n}$ preferably being located at an approximate center of the laminate, the second ceramic layer $2B_1$ is preferably arranged on one end of the laminate, and the second ceramic layer $2B_2$ is preferably arranged on the other end. The coated ceramic layers $2C_{1\ and\ 2}$ are arranged at a portion that is located farther away from the second ceramic layer $2B_1$, and the coated ceramic layers $2C_{3\ and\ 4}$ are arranged at a portion that is located farther away from the second ceramic layer $2B_2$.

The first ceramic layers $2A_{1\ to\ n}$, the second ceramic layers $2B_{1\ and\ 2}$, and the coated ceramic layers $2C_{1\ to\ 4}$ having the above-described multilayered structure also have the following additional structural features. Coil wiring patterns $3_{1\ to\ n}$ are provided on the top surfaces of the first ceramic layers $2A_{1\ to\ n}$, respectively. End portions $3a$ and $3a'$ are included in the coil wiring patterns $3_{1\ and\ n}$, and the end portions $3a$ and $3a'$ are included in the coil wiring patterns $3_{2\ to\ n-1}$. The end portions $3a$ and $3a'$ are connection land patterns having a line width that is slightly greater than the line width of the other portions of the coil wiring patterns $3_{1\ to\ n}$. The first ceramic layers $2A_{1\ to\ n-1}$ each have a first electrical conductor (not shown). The first electrical conductor is arranged in the first ceramic layers $2A_{1\ to\ n-1}$ so as to extend therethrough in the thickness direction. The first electrical conductor is formed as a result of a conductive paste being filled in the through hole provided in the first ceramic layers $2A_{1\ to\ n-1}$. The coil wiring patterns $3_{1\ to\ n}$ that are adjacent to each other in the thickness direction of the ceramic layer are electrically connected to each other via the first electrical conductor. The coil wiring patterns $3_{1\ to\ n}$ that are electrically connected to each other at the end portion $3a$ define a spiral coil.

The circulation trace of the coil conductor 3 preferably has a substantially rectangular-annular shape when viewed from the circulation center-line direction $\alpha$ of the winding coil wiring patterns $3_{1\ to\ n}$ thereof. This is a structure adopted to improve the electrical characteristics by increasing the magnetic flux passing through the coil conductor 3 as much as possible. The pattern of the coil wiring patterns $3_{1\ to\ n}$ is formed so that the coil conductor 3 has such a shape.

Figure 5A:
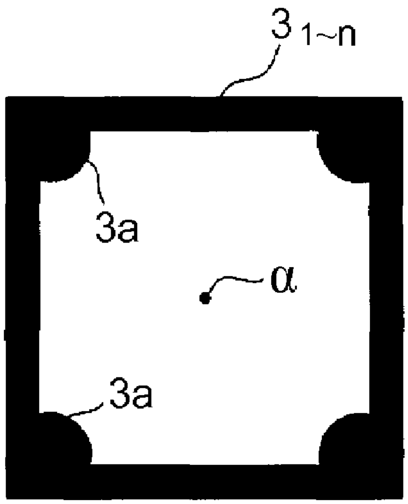
FIGS. 5A and 5B are a schematic view showing the shape of the internal space of a coil conductor.
Figure 5B:
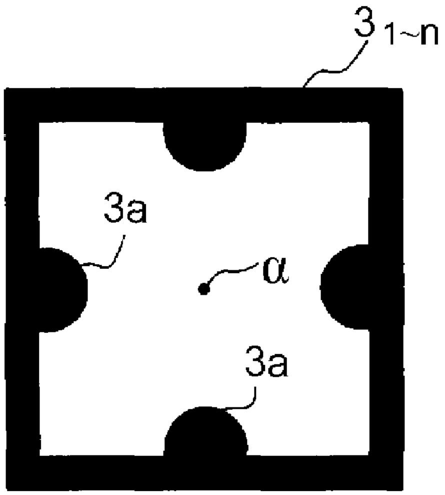

Furthermore, the pattern of each of the coil wiring patterns $3_{1\ to\ n}$ is preferably set so that the end portions $3a$ and $3a'$ extend to the corners of the circulation trace of the coil conductor 3 preferably having a substantially rectangular annular shape. This is due to the following reasons. Between the case in which, as shown in FIG. 5A, the end portion $3a$ is provided in the corner of the circulation trace and the case in which, as shown in FIG. 5B, the end portion $3a$ is provided in a location other than the corner of the circulation trace, in the case in which the end portion $3a$ is provided in the corner, the area where the end portion $3a$ protrudes into the inside of the coil conductor 3 is much smaller. The inside of the coil conductor 3 is an area where the magnetic flux passes through, and the larger the size of this area, the more preferable from the viewpoint of the electrical characteristics (for example, inductance) of the multilayered chip inductor 1. Therefore, in the multilayered chip inductor 1, the end portion $3a$ is arranged in the corner of the circulation trace, thereby minimizing blockage of the magnetic flux and improving the electrical characteristics. In FIGS. 5A and 5B, the circulation trace shape of the coil conductor 3 when viewed from the circulation center-line direction $\alpha$ is shown schematically.

The second ceramic layers $2B_{1\ and\ 2}$ include an external extension electrode connection pattern 5 and a coil connection electrode 6. The external extension electrode connection pattern 5 is provided in a desired surface portion of the second ceramic layers $2B_{1\ and\ 2}$. In this preferred embodiment, the external extension electrode connection pattern 5 is provided at the approximately central position in the plane direction of the second ceramic layers $2B_{1\ and\ 2}$ (the central position of the circulation trace of the coil conductor 3). This is a structure that is arranged to achieve the objective that, when the laminate 2 is formed to have a substantially rectangular shape having a surface that is substantially square and then the multilayered chip inductor 1 is surface-mounted on a circuit substrate, etc., even if any surface of the laminate 2 is arranged to define a mounting surface, the connection point (external extension electrode connection pattern 5) is located at the same distance from the circuit substrate, etc. This structure is very convenient for stabilizing the electrical characteristics of the multilayered chip inductor 1 in a mounted state. However, such a structure of the external extension electrode connection pattern 5 is only an example, and the external extension electrode connection pattern 5 may be arranged at any desired position on the surface of the second ceramic layers $2B_{1\ and\ 2}$.

The coil connection electrode 6 is provided in surface portions of the second ceramic layers $2B_{1\ and\ 2}$ opposing the end portions $3a'$ of the coil wiring patterns $3_{1\ and\ n}$ with the second ceramic layer $2B_1$ or the first ceramic layer $2A_n$ disposed in between. In the end portions and the corner portions of the coil connection electrode 6, corner portions 6*a* having a line width that is slightly greater than the line width of the other portions of the coil connection electrode are formed. The connection wiring pattern 7 has a pattern configuration that connects the external extension electrode connection pattern 5 to the coil connection electrode 6. The connection wiring pattern 7 has a configuration that connects one portion of the coil connection electrode 6 to the external extension electrode connection pattern 5.

A second electrical conductor (not shown) is provided in the second ceramic layer 2B, and the first ceramic layer $2A_n$. Here, the first ceramic layer $2A_n$ is a first ceramic layer in contact with the other second ceramic layer $2B_2$. The second electrical conductor is formed as a result of a conductive paste being filled in the through hole provided in the second ceramic layer $2B_1$ and the first ceramic layer $2A_n$. The second electrical conductor is disposed between the coil connection electrode end portion 3a' of the coil wiring patterns $3_{1\ and\ n}$, and the coil connection electrode 6, which oppose with the ceramic layers $2B_1$ and $2A_n$ disposed in between, and is in contact with them and electrically connects them.

An external extension electrode 9 is provided on the surface of each of the coated ceramic layers $2C_{1\ to\ 4}$. The external extension electrodes 9 are arranged at mutually opposed positions. Furthermore, the external extension electrodes 9 are arranged at positions opposed to the external extension electrode connection pattern 5 with the coated ceramic layer $2C_2$ and the second ceramic layer $2B_2$ disposed in between.

The external extension electrode 9 and the external extension electrode connection pattern 5 are electrically connected to each other via a third electrical conductor 11 provided in the coated ceramic layer $2C_2$ and the second ceramic layer $2B_2$. The external extension electrodes 9 are electrically connected to each other via the third electrical conductor 11 provided in the coated ceramic layers $2C_{1\ and\ 3}$.

Terminal electrodes 10 are provided on the outer surfaces of the coated ceramic layers $2C_{1\ and\ 4}$ positioned at the outermost layers. The terminal electrodes 10 are in contact with the external extension electrode 9 provided on the outer surface of the coated ceramic layer $2C_1$ and the third electrical conductor 11 of the coated ceramic layer $2C_4$, and these are electrically connected together. As a result, the terminal electrode 10 is electrically connected to the coil conductor 3 incorporated in the laminate 2.

The foregoing is the preferred basic structure of the multilayered chip inductor 1. In the configuration of the above-described multilayered chip inductor 1, the location of the second ceramic layers $2B_{1\ and\ 2}$ is preferably at both ends of the ceramic layers $2A_{1\ to\ n}$. However, the second ceramic layers $2B_{1\ and\ 2}$ may be arranged at only the upper end position or at only the lower end position, as desired.

Next, the structural features of the multilayered chip inductor 1 are described. The number of the first ceramic layers $2A_{1\ to\ n}$ increases or decreases due to the adjustment of the electrical characteristics (inductance, etc.) required for the multilayered chip inductor 1. Therefore, in the first ceramic layers $2A_{1\ to\ n}$ positioned at both ends of the first ceramic layers $2A_{1\ to\ n}$, the arrangement positions of the coil wiring patterns $3_{1\ and\ n}$ are displaced in accordance with the number of the first ceramic layers $2A_{1\ to\ n}$. As a result, the positions of the end portions 3a' of the coil wiring patterns $3_{1\ and\ n}$ that oppose the coil connection electrode are also displaced.

The corner portion 6a of the coil connection electrode 6 provided in the second ceramic layers $2B_{1\ and\ 2}$ must be arranged so as to oppose the displaced end portion 3a' opposing the coil connection electrode. Conventionally, the second ceramic layers having a corresponding coil connection electrode corresponding to the displaced end portion 3a' opposing the coil connection electrode are provided in advance. As a result, the displacement of the end portion 3a' opposing the coil connection electrode is dealt with. However, a lot of time and effort is required for manufacturing operations.

In comparison with this, as shown in FIGS. 1 to 4, the coil connection electrode 6 of the multilayered chip inductor 1 of this preferred embodiment has a configuration that connects together the surface portion of the second ceramic layers 2B opposed to the displaced end portion 3a' opposing the coil connection electrode. In this preferred embodiment, the coil conductor 3 preferably has a substantially rectangular annular shape when viewed from the circulation center-line direction α of the coil wiring patterns $3_{1\ to\ n}$. Furthermore, the end portions 3a and 3a' are arranged in the corners of the coil conductor 3 which preferably has a substantially rectangular annular shape. In response to this, the coil connection electrode 6 has the following shape.

The coil connection electrode 6 preferably is arranged to extend along the circulation trace of the coil conductor 3 when viewed from the circulation center-line direction α, that is, in a portion of the pattern of the substantially rectangular annular shape. The pattern width of the coil connection electrode 6 is preferably equal to the pattern width of the coil wiring patterns $3_{1\ to\ n}$. Furthermore, each of the corner portions 6a of the coil connection electrode 6 opposing the end portion 3a' of each of the coil wiring patterns $3_{1\ to\ n}$ that opposes the coil connection electrode, positioned in the corner of the coil conductor (rectangular annular shape) 3, preferably has a connected land configuration. More specifically, the corner portion 6a preferably has a shape that is substantially identical to that of the end portion 3a' opposing the coil connection electrode, and the pattern width of the corner portion 6a is slightly greater than the pattern width of the coil connection electrode 6 similarly to the end portion 3a' opposing the coil connection electrode.

Figure 6:
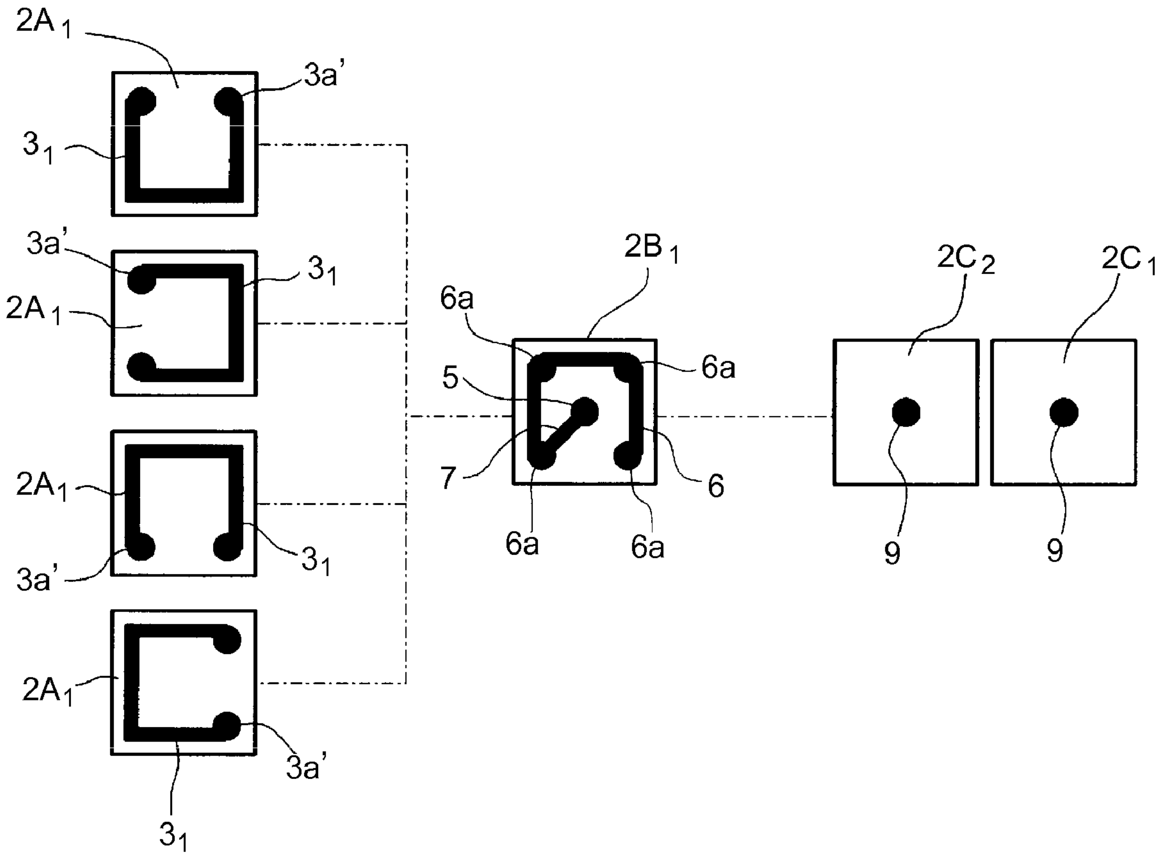
FIG. 6 is a development view showing each pattern of the connection structure of the multilayered chip inductor according to a preferred embodiment of the present invention.

As a result of the coil connection electrode 6 being configured in this manner, as shown in FIG. 6, in the multilayered chip inductor 1, even if the arrangement position of the end portion 3a' of the first ceramic layer $2A_{1\ and\ n}$ that opposes the coil connection electrode is displaced, one of the plurality of the corner portions 6a provided in the coil connection electrode 6 always opposes the end portion 3a' opposing the coil connection electrode. As a result, even if the end portion 3a' of the coil wiring patterns $3_{1\ and\ n}$ that opposes the coil connection electrode is displaced to any position, the coil wiring patterns $3_{1\ and\ n}$ is electrically connected to the terminal electrode 10 via the coil connection electrode 6, the connection wiring pattern 7, the external extension electrode connection pattern 5, the second electrical conductor, and the external extension electrode 9. Therefore, in the multilayered chip inductor 1, it is not necessary to produce and store a plurality of second ceramic layers $2B_{1\ and\ 2}$ each having the coil connection electrode 6 corresponding to the displacement of the coil wiring patterns $3_{1\ and\ n}$. Furthermore, the multilayered chip inductor 1 can be produced without undergoing a complex process of using a plurality of different the second ceramic layers $2B_{1\ and\ 2}$.

In the multilayered chip inductor 1, the coil connection electrode 6 has a shape that constitutes a portion of the substantially rectangular annular shape that is preferably substantially identical to the circulation trace of the coil wiring patterns $3_{1\ to\ n}$. Here, the multilayered chip inductor 1 preferably has substantially the shape of the letter "C" in which one end of the annular shape of the coil connection electrode 6 having a substantially rectangular annular shape is separated. The coil connection electrode 6 having such a shape constitutes a portion of the pattern shape of the coil conductor 3. As a result, the electrical characteristics (inductance, etc.) of the multilayered chip inductor 1 are improved, and also, the electrical characteristics required for the multilayered chip inductor 1 can be obtained while the size of the apparatus can be reduced.

The shape of the coil connection electrode 6 is configured to extend along the circulation trace of the coil conductor 3 when viewed from the circulation center-line direction $\alpha$. As a result, the coil connection electrode 6 hardly blocks the magnetic flux passing through the inside of the coil conductor 3, and the electrical characteristics of the multilayered chip inductor 1 are improved correspondingly. Furthermore, the connection wiring pattern 7 preferably has a straight-line shape that connects one portion of the coil connection electrode 6 to the external extension electrode connection pattern 5. Therefore, the area where the connection wiring pattern 7 blocks the magnetic flux passing through the inside of the coil conductor 3 is at a minimum, and also, the electrical characteristics (inductance, etc.) of the multilayered chip inductor 1 are improved correspondingly.

The end portions 3*a* and 3*a*' of each of the coil wiring patterns $3_{1\ to\ n}$ are preferably positioned in the corners of the circulation trace of the coil conductor 3 having the substantially rectangular annular shape. Between the case in which the end portions 3*a* and 3*a*' are provided in the corners of the circulation trace of the coil conductor 3 and the case in which they are provided at positions other than those, the area where the end portions 3*a* and 3*a*' block the internal space of the coil conductor 3 differs. In the case in which the end portions 3*a* and 3*a*' are provided in the corners, the area is smaller. For this reason, in the structure of the multilayered chip inductor 1 in which the end portions 3*a* and 3*a*' are provided in the corners, the area where the internal space of the coil conductor 3 is blocked is decreased further, and the electrical characteristics (inductance, etc.) are further improved correspondingly.

Although the shape of the end portions 3*a* and 3*a*' of the coil conductor 3 has been described as preferably being a connection land shape that is wider than the coil wiring patterns $3_{1\ to\ n}$, the shape may be substantially circular or substantially rectangular.

Figure 3:
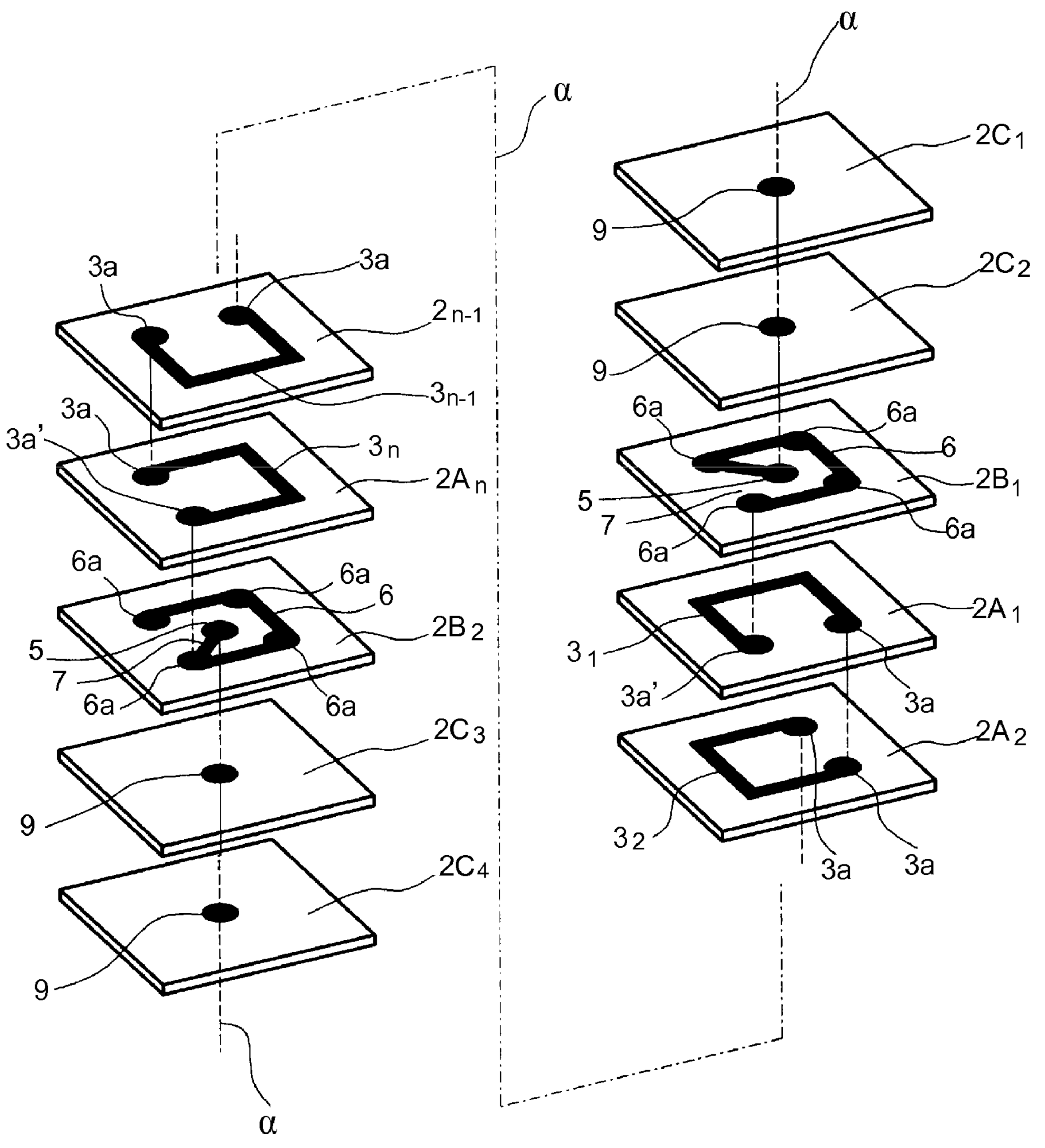
FIG. 3 is a exploded perspective view showing a modification of the multilayered chip inductor according to a preferred embodiment of the present invention.

As shown in FIG. 3, as a result of forming the shape of each of the coil connection electrodes 6 formed in the second ceramic layers $2B_{1\ and\ 2}$ so as to correspond to the direction of the electrical current flowing through the coil, even if the arrangement position of the end portion 3*a*' of the first ceramic layers $2A_{1\ and\ n}$ that opposes the coil connection electrode is displaced, the direction of the electrical current can be reliably fixed, and thus characteristics such as inductance can be prevented from decreasing. However, in this case, it is necessary to provide the coil connection electrodes 6 having shapes that are different from each other, which are formed in the second ceramic layer $2B_1$ and the second ceramic layer $2B_2$, and the cost increases.

Figure 7A:
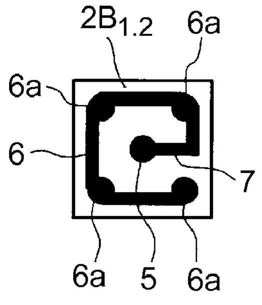
FIGS. 7A-7G are a schematic view showing a modification of an external extension electrode connection pattern, a coil connection electrode, and a connection wiring pattern located in a second ceramic layer of a preferred embodiment of the present invention.
Figure 7B:
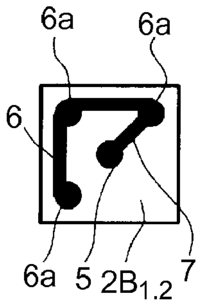
Figure 7C:
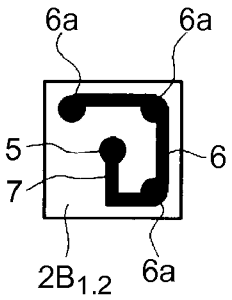
Figure 7D:
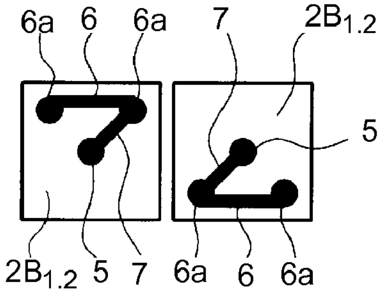
Figure 7E:
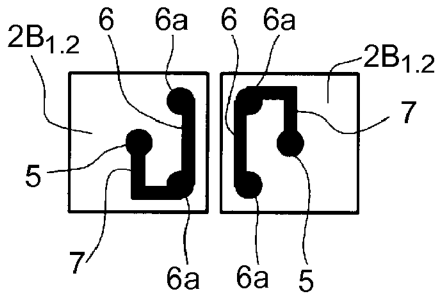
Figure 7F:
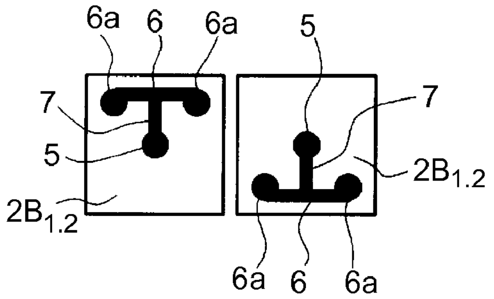
Figure 7G:
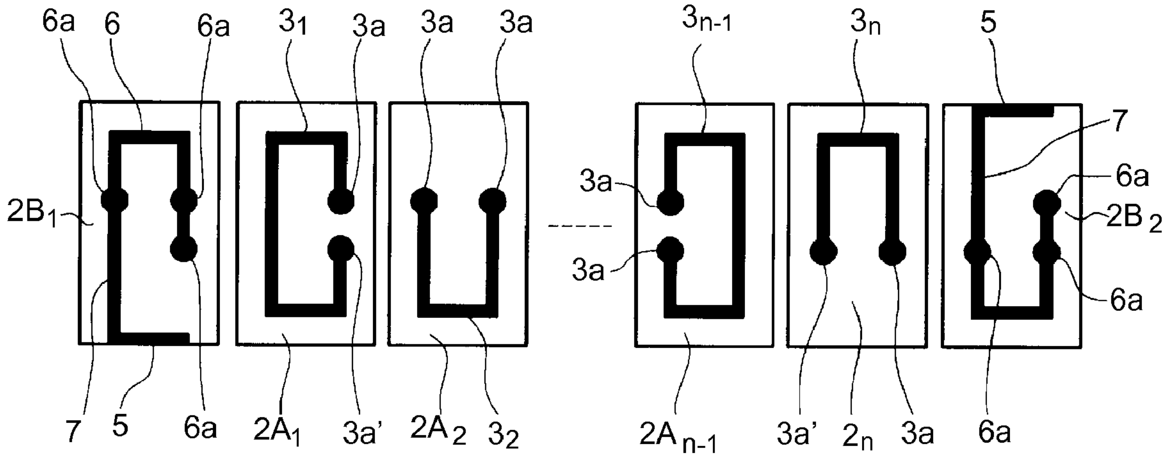

The shapes of the external extension electrode connection pattern 5, the coil connection electrode 6, and the connection wiring pattern 7 formed in the second ceramic layers $2B_{1\ and\ 2}$ may be as shown in FIGS. 7A to 7G in addition to those shown in FIGS. 1 to 6. The coil connection electrode 6 in FIG. 7A, similarly to the structures of FIG. 1 to FIG. 6, is arranged to extend along the circulation trace of the coil conductor 3, in which the four corners of the circulation trace are covered. The coil connection electrode 6 in FIGS. 7B and 7C is arranged to extend along the circulation trace of the coil conductor 3, in which the three corners of the circulation trace are covered. In this case, the coil connection electrode 6 needs to be provided in the remaining one corner, and also, other second ceramic layers $2B_{1\ and\ 2}$ having the connection wiring pattern 7 that connects the coil connection electrode 6 to the electrode connection pattern 5 needs to be provided. The coil connection electrode 6 in FIGS. 7D to 7F is arranged to extend along the circulation trace of the coil conductor 3 and that covers the two corners of the circulation trace. In this case, other second ceramic layers $2B_{1\ and\ 2}$ extending along the circulation trace of the coil conductor 3 and covering the remaining two corners needs to be provided. In FIGS. 7D to 7F, the two second ceramic layers $2B_{1\ and\ 2}$ used in combination are shown. In the examples of FIGS. 7B to 7F, the second ceramic layers $2B_{1\ and\ 2}$ may be rotated by 90° or 180° and used. FIG. 7G shows an example in which the end portions 3*a* are provided in locations other than the corners of the coil wiring patterns $3_{1\ to\ n}$ forming the coil conductor 3 having a circulation trace with a substantially rectangular annular shape. Furthermore, in FIG. 7G, the external extension electrode connection patterns 5 provided in the second ceramic layers $2B_{1\ and\ 2}$ are provided on the side surfaces of the second ceramic layers $2B_{1\ and\ 2}$ without providing the coated ceramic layers $2C_{1\ to\ 4}$ having the external extension electrode 9. In this case, the connection wiring patterns 7 connect the external extension electrode connection patterns 5 arranged on the side surfaces of the second ceramic layers $2B_{1\ and\ 2}$ to the coil connection electrodes 6. In this structure, the terminal electrode 10 is provided on the side surface of the laminate 2.

Figure 8:
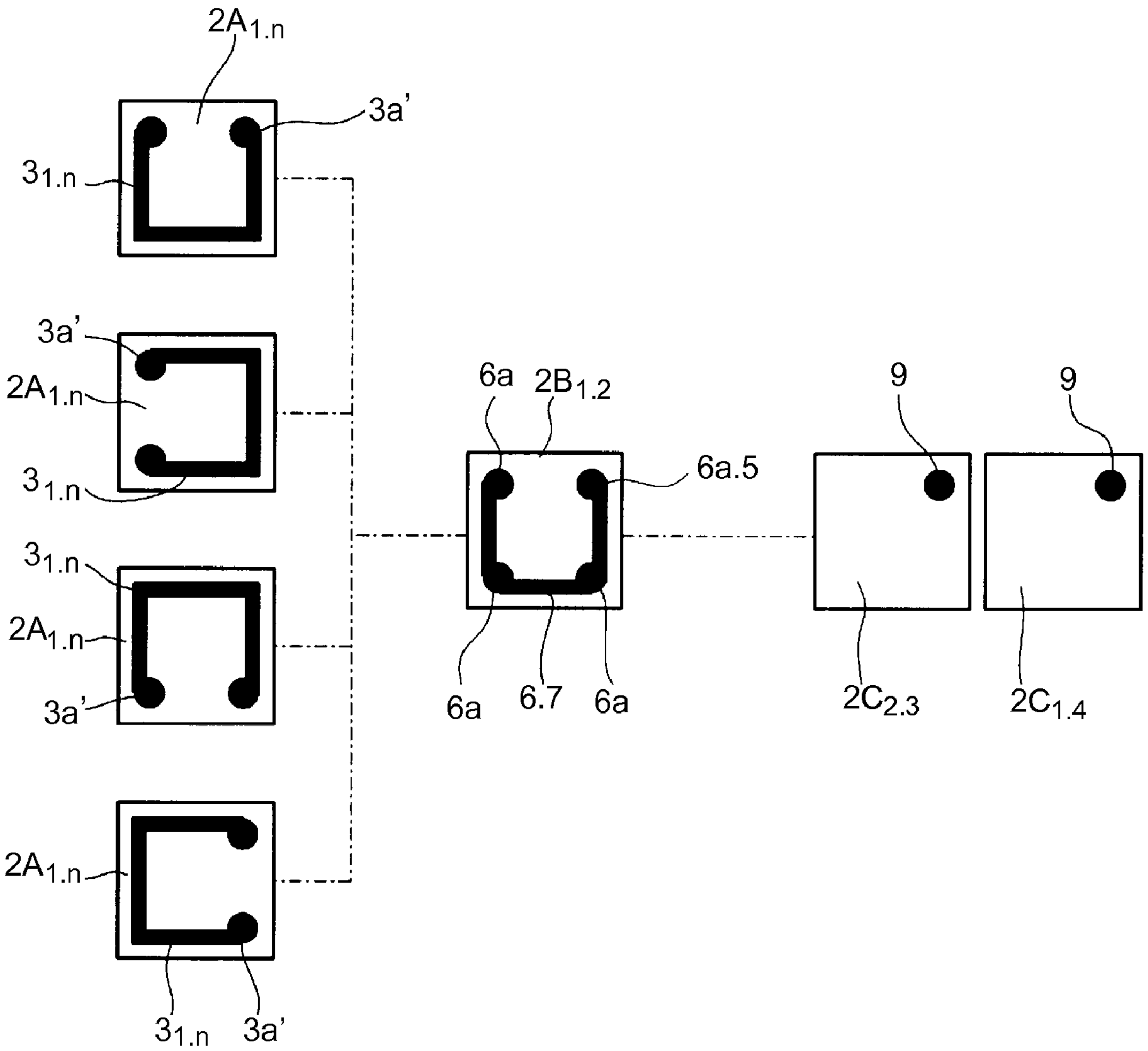
FIG. 8 is a development view showing a modification of each pattern of the multilayered chip inductor of a preferred embodiment of the present invention.

In the above-described multilayered chip inductor 1, the external extension electrode connection pattern 5 and the external extension electrode 9 are provided at the approximate central position on the surfaces of the second ceramic layers $2B_{1\ and\ 2}$ and the coated ceramic layers $2C_{1\ to\ 4}$ (the central position of the circulation trace of the coil conductor 3). In addition, as shown in FIG. 8, in the multilayered chip inductor having the external extension electrode connection pattern 5 and the external extension electrode 9 arranged in the corners of the circulation trace of the coil conductor 3 (the position at which the end portion 3*a* and the coil connection electrode 6 are formed), the present invention is practiced. In this case, as shown in FIG. 8, the external extension electrode connection pattern 5 is also served by the pattern of the coil connection electrode 6 (one of the corner portions 6). Furthermore, the connection wiring pattern 7 is also served by the coil connection electrode 6. In the structure of FIG. 8 in which the connection wiring pattern 7 is also served by the coil connection electrode 6, the block of the magnetic flux of the coil conductor 3 by the connection wiring pattern 7 does not occur at all. The electrical characteristics (inductance, etc.) of the multilayered chip inductor are further improved correspondingly.

In the structure shown in FIG. 8, the pattern shape of the coil connection electrode 6 is preferably the same as the pattern shape of the coil wiring patterns $3_{1\ and\ n}$ that may be positioned in the end portions of the coil conductor 3. For this reason, when the coil wiring patterns $3_{1\ and\ n}$ having such a pattern shape are arranged, the coated ceramic layers $2C_{1\ to\ 4}$ need only to be laminated directly on the coil wiring patterns $3_{1\ and\ n}$ without arranging the second ceramic layers $2B_{1\ and\ 2}$. In this case, the number of the coated ceramic layers $2C_{1\ to\ 4}$ needs to be increased by the number corresponding to the number of the removed second ceramic layers $2B_{1\ and\ 2}$ for which number adjustment is made. Furthermore, since the pattern shape of the coil connection electrode 6 is preferably the same as one of the pattern shapes of the coil wiring patterns $3_{1\ to\ n}$, it is possible to allow the first ceramic layers $2A_{1\ to\ n}$ having the coil wiring patterns $3_{1\ to\ n}$ whose shape is preferably the same as the coil connection electrode 6 to also serve as the second ceramic layers $2B_{1\ and\ 2}$.

Figure 9:
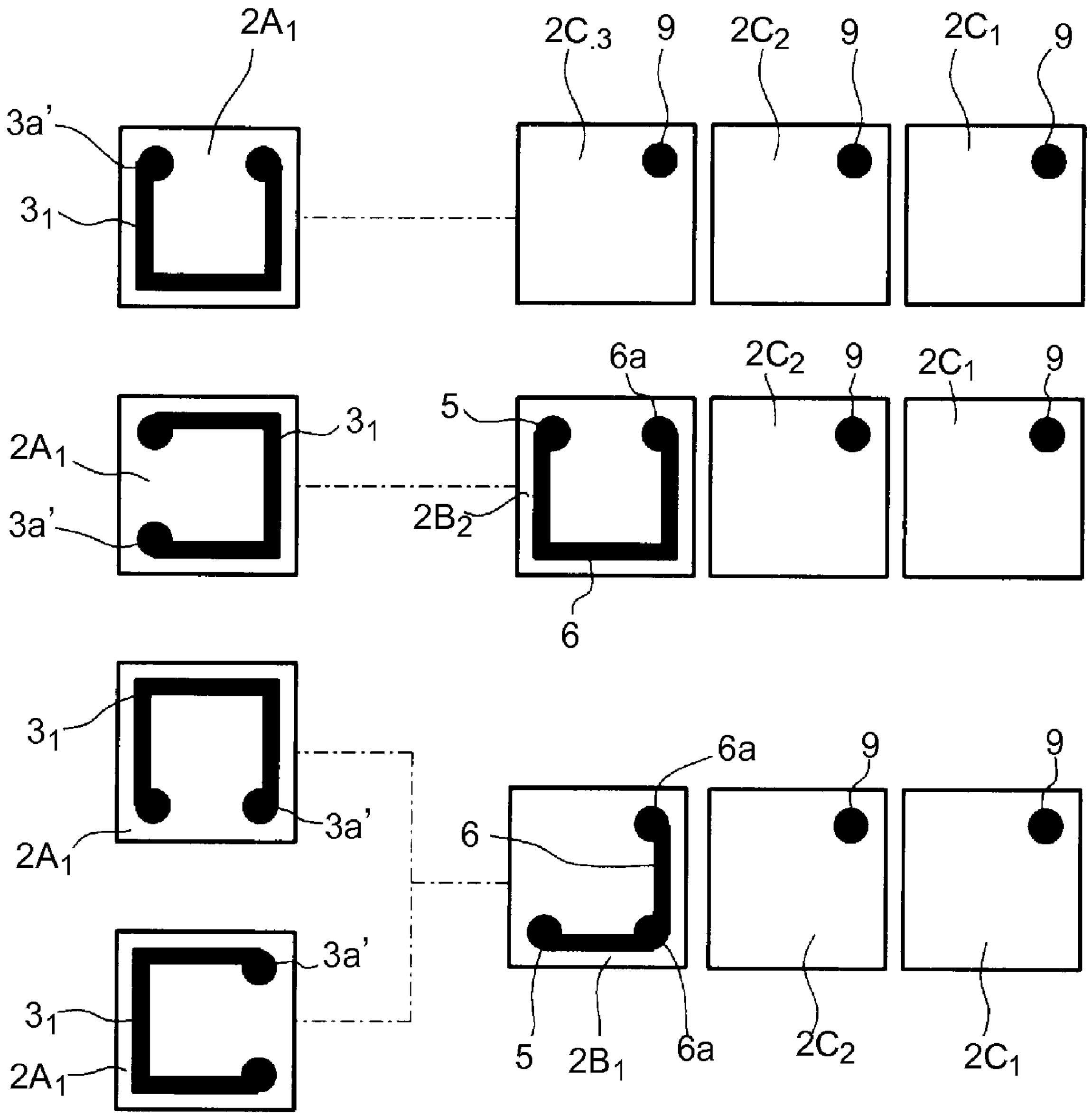
FIG. 9 is a development view showing another modification of each pattern of the connection structure of the multilayered chip inductor of a preferred embodiment of the present invention.

When the foregoing is taken into consideration, the second ceramic layers $2B_{1\ and\ 2}$ can be put into practical use also at the combination pattern shown in FIG. 9. In FIG. 9, the second ceramic layers $2B_{1\ and\ 2}$ on which the coil connection electrode 6 having two corner portions 6*a* is formed, and the second ceramic layers $2B_{1\ and\ 2}$ that also serves as one of the first ceramic layers $2A_{1\ to\ n}$ are preferably used. Depending on the shape of the coil wiring patterns $\mathbf{3}_{1\ to\ n}$ in the first ceramic layers $2A_{1\ and\ n}$, the number of the second ceramic layers $2B_{1\ and\ 2}$ is reduced, and the number of the coated ceramic layers is increased correspondingly. In FIG. 9, the increased coated ceramic layer is shown as a coated ceramic layer $2C_3$.

Figure 10:
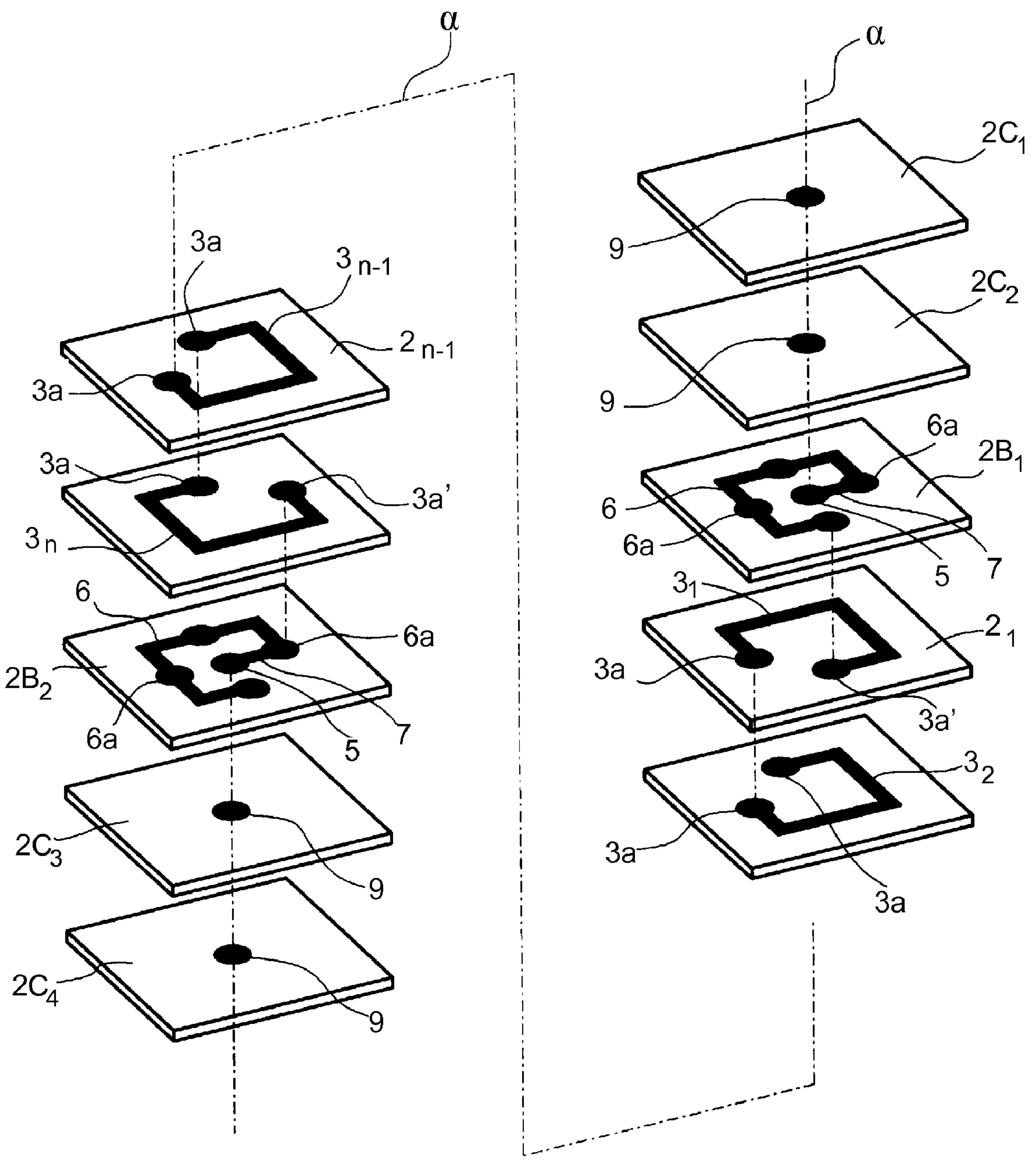
FIG. 10 is an exploded perspective view showing another modification of each pattern of the connection structure of the multilayered chip inductor of a preferred embodiment of the present invention.
Figure 11:
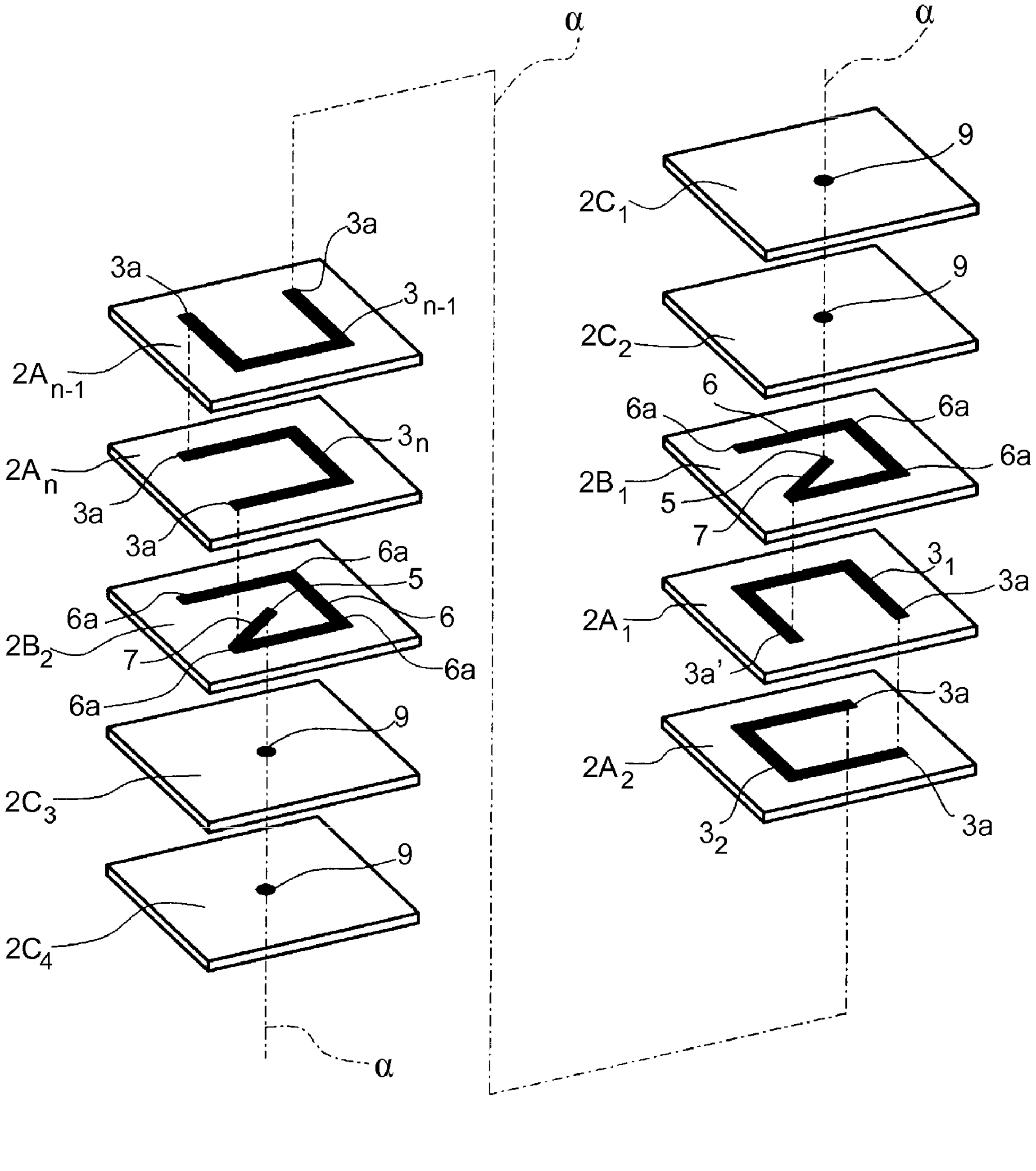
FIG. 11 is an exploded perspective view showing another modification of each pattern of the connection structure of the multilayered chip inductor of a preferred embodiment of the present invention.

In the structure shown in, for example, FIGS. 1 to 4, the end portions 3*a* and 3*a*' of the coil wiring patterns $\mathbf{3}_{1\ to\ n}$ are preferably arranged at the corners of the circulation trace of the coil conductor 3. However, as shown in FIG. 10, the end portions 3*a* and 3*a*' may be provided in a halfway portion other than the corners of the circulation trace of the coil conductor 3. In this case, the arrangement position of the coil connection electrode 6 provided in the second ceramic layers $2B_{1\ and\ 2}$ differs. Furthermore, in, for example, FIGS. 1 to 5, the end portions 3*a* and 3*a*', the coil connection electrode 6, and the external extension electrode connection pattern 5 are preferably formed to have a connection land configuration that is wider than the surrounding wiring pattern. Alternatively, as shown in FIG. 11, the end portions 3*a* and 3*a*', the coil connection electrode 6, and the external extension electrode connection pattern 5 may be formed to have a pattern shape having the same width as that of the surrounding wiring pattern, as shown in FIG. 11.

Figure 12:
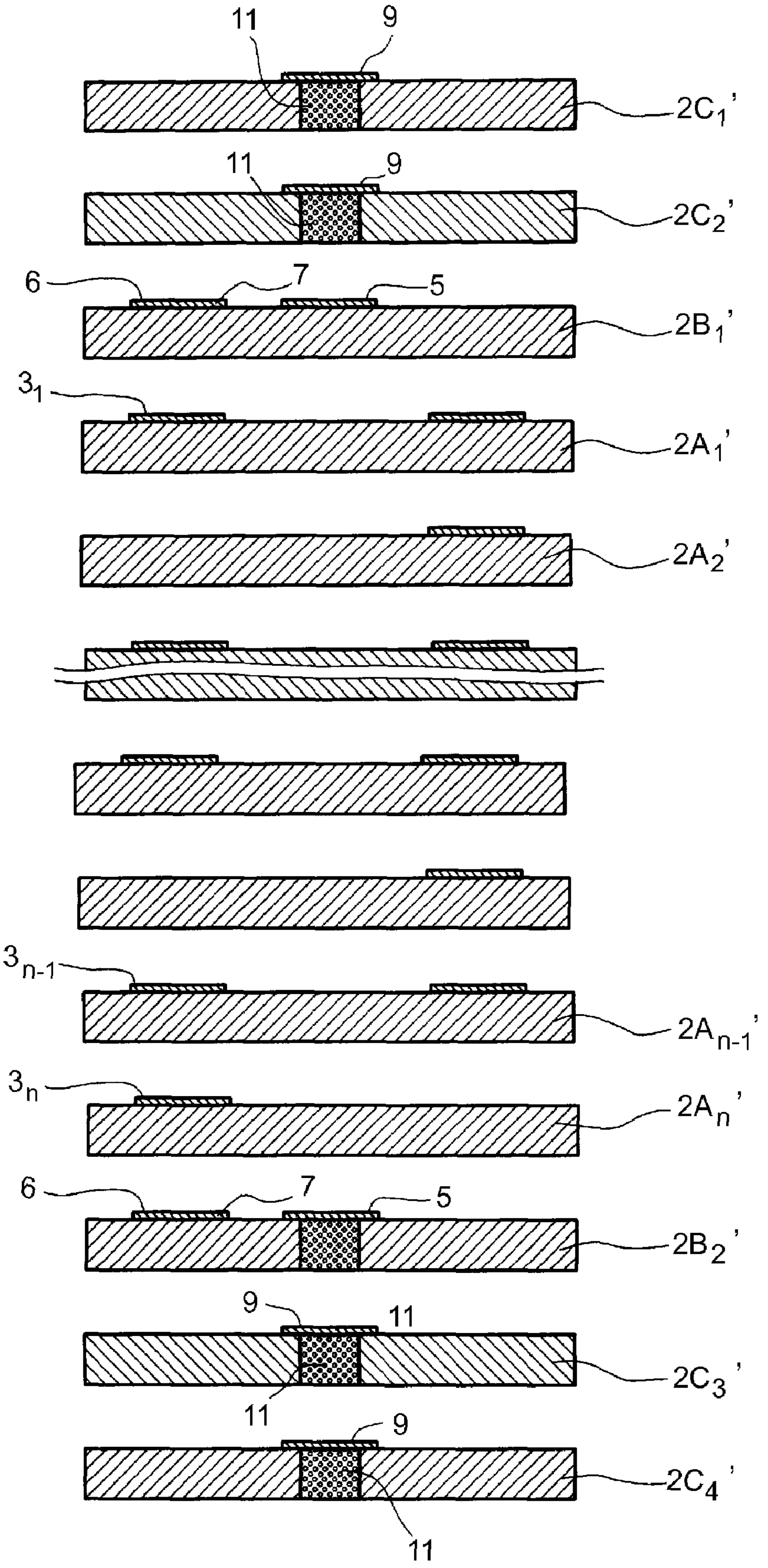
FIG. 12 is a sectional view showing a method of manufacturing the multilayered chip inductor of a preferred embodiment of the present invention.
Figure 13:
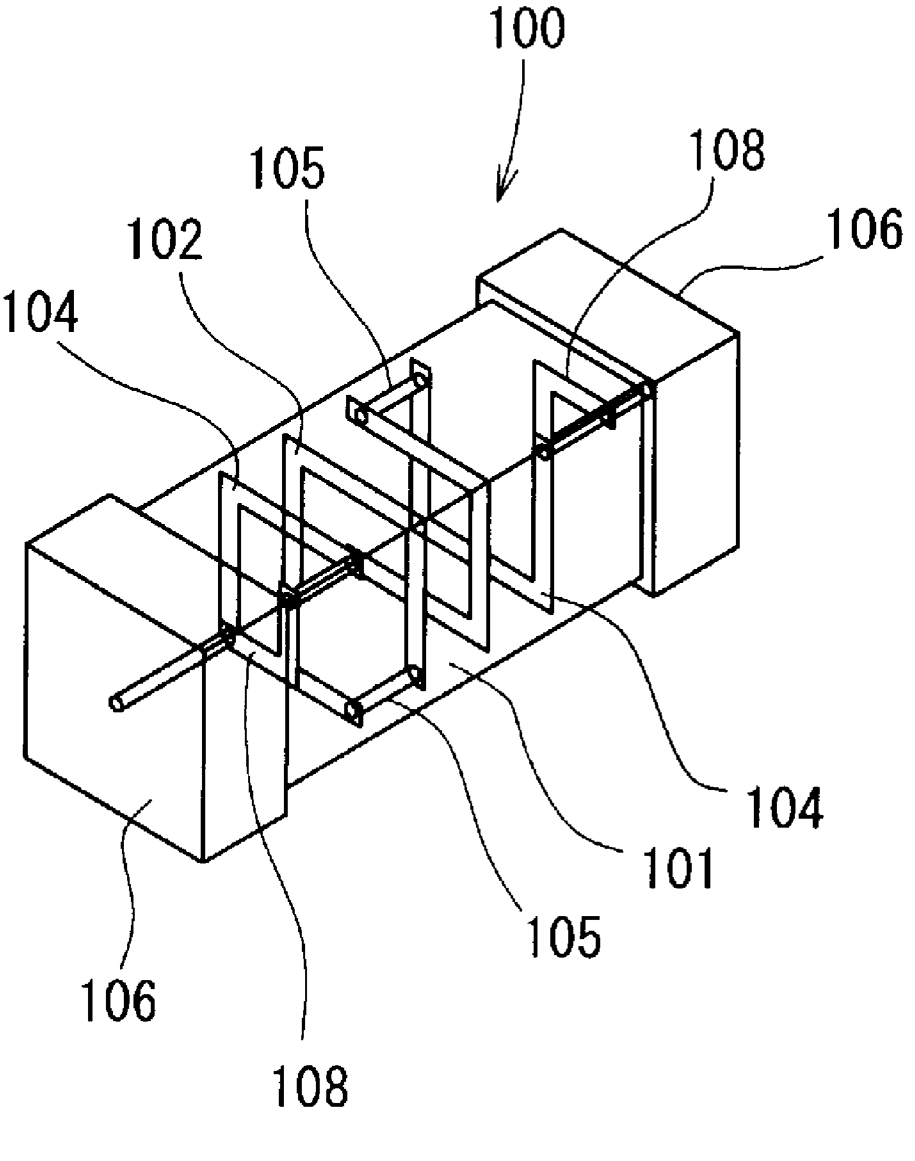
FIG. 13 PRIOR ART
FIG. 13 is a perspective view showing the structure of a known example of a multilayered electronic component.
Figure 14:
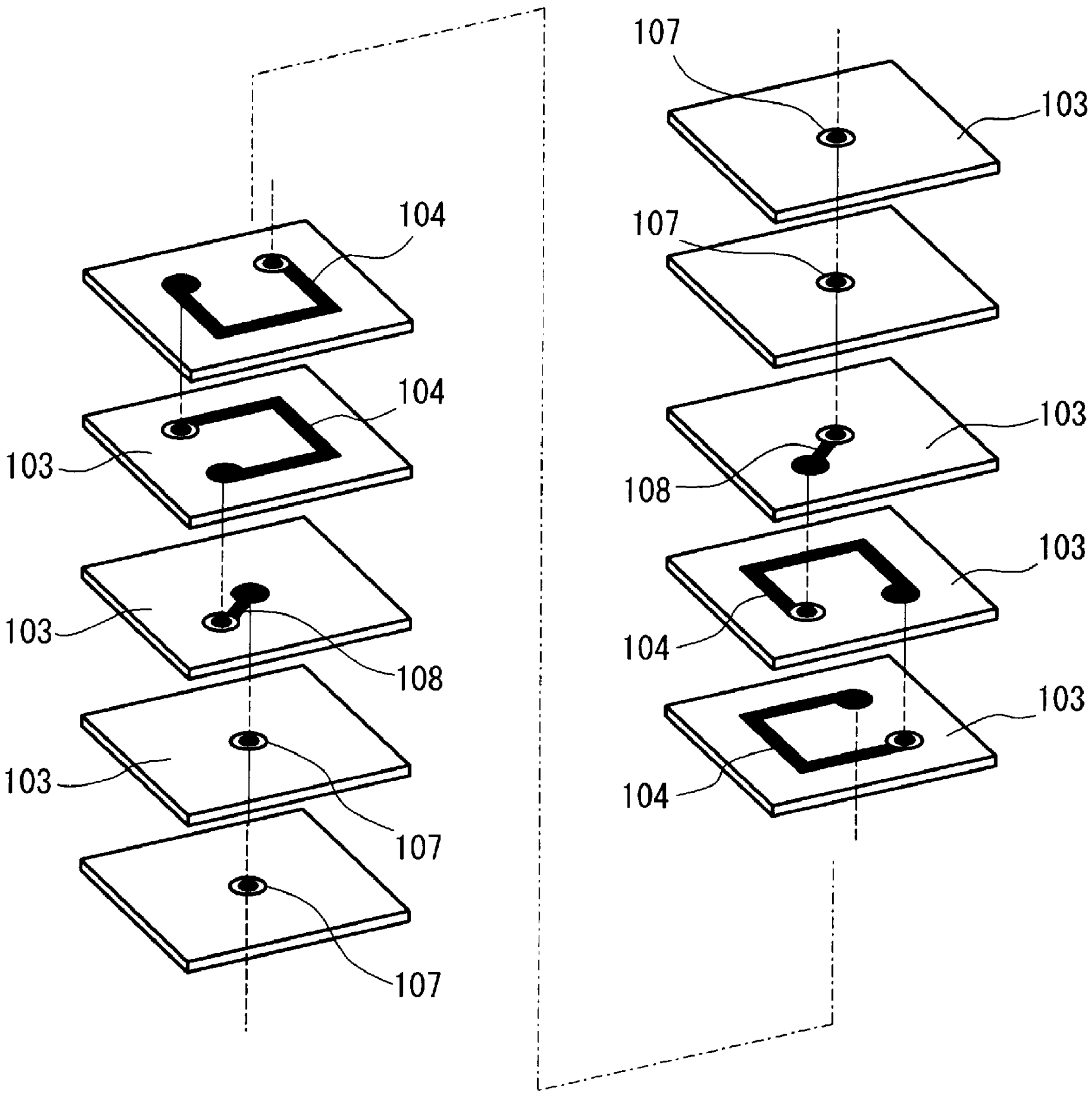
FIG. 14 PRIOR ART
FIG. 14 is an exploded perspective view showing the structure of the known example of a multilayered electronic component.

Next, a description is given of the method of manufacturing the multilayered chip inductor 1. As shown in FIG. 12, a plurality of first ceramic green layers $2A_{1\ to\ n}$', second ceramic green layers $2B_{1\ and\ 2}$', and coated ceramic green layers $2C_{1\ to\ 4}$' having a substantially rectangular shape or a substantially square shape are provided. These ceramic green layers are manufactured, for example, in the following manner. Materials, such as magnetic powder (ferrite powder, etc.), a binder, and a plasticizer, are mixed. These materials are ground and mixed by a ball mill and form a slurry composite. Thereafter, they are de-aerated to adjust the viscosity. The composite having the adjusted viscosity is transferred as a ceramic green layer onto a carrier film by a technique such as a doctor-blade method. A non-magnetic material, such as a glass ceramic, may also be used in place of the magnetic powder.

First electrical conductors (not shown) are formed in the respective first ceramic green layers $2A_{1\ to\ n-1}$' so as to extend therethrough in the thickness direction thereof. The first electrical conductor is formed in such a way that, after a through hole is formed in the first ceramic green layers $2A_{1\ to\ n-1}$', an electrical conductor, such as a conductive paste, is filled therein. A second electrical conductor (not shown) is formed in the first ceramic green layer $A_n$' and the second ceramic green layer $2B_1$' so as to extend therethrough in the thickness direction thereof. The second electrical conductor is formed in such a way that, after a through hole is formed in the first ceramic green layer $2A_n$' and the second ceramic green layer $2B_1$', an electrical conductor, such as a solder, a conductive paste, or a conductive resin, is filled in the through hole. In this manner, the second electrical conductor basically has a structure that is preferably substantially identical to that of the first electrical conductor. In the second ceramic green layer $2B_2$' and the coated ceramic green layers $2C_{1\ to\ 4}$', a third electrical conductor 11 is formed so as to extend therethrough in the thickness direction thereof. The third electrical conductor 11 is formed in such a way that, after a through hole is formed in the second ceramic green layer $B_2$' and the coated ceramic green layer $22C_{1\ to\ 4}$', an electrical conductor, such as a conductive paste, is filled in the through hole. As described above, the third electrical conductor 11 basically has a structure that is preferably substantially identical to that of the first electrical conductor.

The coil wiring patterns $\mathbf{3}_{1\ to\ n}$ are formed on the respective top surfaces of the first ceramic green layers $2A_{1\ to\ n}$'. The coil wiring patterns $\mathbf{3}_{1\ to\ n}$ are preferably formed by a technique, for example, thick-film printing, coating, vapor deposition, or sputtering. One end of the coil wiring patterns $\mathbf{3}_{1\ to\ n}$ of each of the first ceramic green layers $2A_{1\ to\ n}$' is arranged at a position opposing the first electrical conductor of the first ceramic green layers $2A_{1\ to\ n}$'.

The external extension electrode connection pattern 5, the coil connection electrode 6, and the connection wiring pattern 7 are formed on the respective top surfaces of the second ceramic green layers $2B_{1\ and\ 2}$'. The external extension electrode connection pattern 5, the coil connection electrode 6, and the connection wiring pattern 7 are preferably formed by a technique, for example, thick-film printing, coating, vapor deposition, or sputtering. The coil connection electrode 6 is formed to have the following shape. The coil connection electrode 6 is formed to have a shape in which each surface portion of the opposed second ceramic green layers $2B_{1\ and\ 2}$' is connected to each displacement point of the end portion 3*a*' that opposes the coil connection electrode. The end portion 3*a*' is an end portion 3*a* of the coil wiring pattern $\mathbf{3}_{1\ and\ n}$ opposing the coil connection electrode 6 in the manner described above.

As described above, the position of the end portion 3*a*' that opposes the coil connection electrode is displaced due to an increase or decrease in the number of the first ceramic layers $2A_{1\ to\ n}$. The external extension electrode connection pattern 5 is formed in a predetermined surface portion in the second ceramic green layers $2B_{1\ and\ 2}$'. In this preferred embodiment, the external extension electrode connection pattern 5 is preferably formed at the central position of the circulation trace of the coil conductor 3. The connection wiring pattern 7 is preferably formed to have a shape in which the external extension electrode connection pattern 5 and the coil connection electrode 6 are connected together in a straight-line manner.

The third electrical conductor 11 formed in the coated ceramic layers $2C_{1\ to\ 4}$' is formed at a position opposing the electrode connection pattern 5.

The first ceramic green layers $2A_{1\ to\ n}$', the second ceramic green layers $2B_{1\ and\ 2}$', and the coated ceramic green layers $2C_{1\ to\ 4}$' are laminated in sequence. At this time, the end portion 3*a* of the coil wiring patterns $\mathbf{3}_{1\ to\ n}$ of the first ceramic green layers $2A_{1\ to\ n}$' is arranged at a position opposing the first electrical conductor of the first ceramic green layers $2A_{1\ to\ n}$' adjacent to the first ceramic green layers $2A_{1\ to\ n}$'. For this reason, as a result of the first ceramic green layers $2A_{1\ to\ n}$' being laminated, the coil wiring patterns $\mathbf{3}_{1\ to\ n}$ of the respective ceramic green layer $2A_{1\ to\ n}$' come into contact with the first electrical conductors of the adjacent first ceramic green layer $2A_{1\ to\ n}$'. As a result, the coil wiring patterns $\mathbf{3}_{1\ to\ n}$ are electrically connected together, and are formed to define the shape of the spiral coil conductor 3 as a whole.

At this time, the number of the first ceramic green layers $2A_{1\ to\ n}$' varies in accordance with the electrical characteristics (inductance, etc.) required for the multilayered chip inductor 1. As a result, the position of the end portion 3*a*' opposing the coil connection electrode in the first ceramic green layers $2A_{1\ and\ n}$' is displaced in accordance with the number of sheets. However, the shape of the coil connection electrodes 6 provided in the second ceramic green layers $2B_{1\ and\ 2}$' has a shape opposing a plurality (for example, all in this preferred embodiment) of the displaced end portions 3*a*' opposing the coil connection electrode. For this reason, even if the end portion 3*a*' opposing the coil connection electrode is displaced, the coil connection electrode 6 can be electrically connected, via the second electrical conductor, to the displacement points of the plurality (for example, all in this preferred embodiment) of the end portions 3$a'$ opposing the coil connection electrode. As a result, it becomes possible to deal with the displacement pattern of the end portion 3$a'$ opposing the coil connection electrode by a minimum required number (for example, one in this preferred embodiment) of coil connection electrodes 6.

The multilayered ceramic green layers 2$A_{1\ to\ n}'$, 2$B_{1\ and\ 2}'$, and 2$C_{1\ to\ 4}$ are preferably compression-molded. Furthermore, the compression-molded ceramic green layers 2$A_{1\ to\ n}'$, 2$B_{1\ and\ 2}'$, and 2$C_{1\ to\ 4}$ are each cut to define a multilayered chip inductor structure. In FIG. 12, only one component area is shown rather than being shown in a sheet state. The masters of each multilayered chip inductor to be cut are laminated in an integral manner by a calcining process. The calcining process is carried out, for example, by a de-binder process at about 500° C. and by the main calcining process at about 900° C. The ceramic green layers that are laminated in an integral manner define the laminate 2.

Finally, as shown in FIG. 1, the terminal electrode 10 is formed on the surface of the laminate 2. The terminal electrode 10 is arranged so as to cover the surfaces of the coated ceramic layers 2$C_{1\ and\ 4}$. The terminal electrode 10 is formed by a method of immersing the laminate 2 with a conductive paste. Examples of the conductive material contained in the conductive paste include, in addition to silver (Ag), a metal such as Ag—Pd, nickel (Ni), and copper (Cu), and an alloy thereof. For the method of forming the terminal electrode 10, in addition to the above-described methods, printing, vapor deposition, and sputtering may be used. On the surface of the formed terminal electrode 10, Ni plating is preferably performed, and thereafter, Sn plating is preferably performed.

In the method of manufacturing the above-described multilayered chip inductor 1, the coil connection electrode 6 is formed along the circulation trace of the coil conductor 3 when viewed from the circulation center-line direction α of the coil conductor 3. As a result, the block of the magnetic flux of the coil conductor 3 by the coil connection electrode 6 is minimized. Furthermore, the coil connection electrode 6 preferably has a substantially annular shape in which one end is separated. As a result, the coil connection electrode 6 also functions as a part of the coil conductor 3, and the electrical characteristics (inductance, etc.) of the multilayered chip inductor 1 are improved correspondingly. Furthermore, the size reduction of the multilayered chip inductor 1 becomes possible by an amount corresponding to the amount by which the electrical characteristics can be improved with the number of ceramic layers being decreased.

Furthermore, the shape of the coil wiring patterns $\mathbf{3}_{1\ to\ n}$ is preferably set so that the circulation trace of the coil conductor 3 when viewed from the circulation center-line direction α has a substantially rectangular shape. As a result, the area where the magnetic flux passes through in the coil conductor 3 can be increased as much as possible. The characteristics of the multilayered chip inductor 1 are improved correspondingly, and furthermore, the size of the shape can be greatly reduced.

In addition, the respective end portions 3$a$ of the coil wiring patterns $\mathbf{3}_{1\ to\ n}$ are arranged in the corners of the coil conductor 3 in which the circulation trace when viewed from the circulation center-line direction α of the coil conductor 3 has a substantially rectangular shape. As a result, the block of the magnetic flux of the coil conductor by the coil connection electrode can be reduced further.

The method of manufacturing the multilayered electronic component according to the present invention is not limited to the above-described preferred embodiments, and can be changed variously within the spirit and scope of the present invention. For example, the present invention can also be applied to, in addition to the multilayered chip inductor, a high-frequency module, which is formed by a single unit, such as a multilayer chip impeder, a coupler, a balun, a delay line, a multilayered substrate, or an multilayer LC filter (a low-pass filter, a band-pass filter, a band elimination filter, or a high-pass filter) using a via inductor in which via holes are coupled, or a high-frequency module, which is formed in combination with the above-described multilayered electronic component.

Although the first preferred embodiment adopts a structure in which the coil axis is preferably substantially parallel to the mounting surface, a structure in which the coil axis intersects at right angles with the mounting surface may be used.

The present invention exhibits tremendous advantages as a result of being used in, besides the multilayered chip inductor, a high-frequency module, which is defined by a single unitary member, such as a multilayer chip impeder, a coupler, a balun, a delay line, a multilayered substrate, or an multilayer LC filter (a low-pass filter, a band-pass filter, a band elimination filter, or a high-pass filter) using a via inductor in which via holes are coupled, or a high-frequency module, which is formed in combination with the above-described multilayered electronic component.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A method of manufacturing a multilayered electronic component including a plurality of first ceramic layers that are laminated in an integral manner to form a laminate; a second ceramic layer that is inserted and arranged at a desired position within the laminate; a coil wiring pattern defining a portion of a coil conductor, said coil wiring pattern being provided on a surface of each of said first ceramic layers; an external extension electrode connection pattern provided on a surface portion of said second ceramic layer; a coil connection electrode arranged so as to extend through a surface portion of said second ceramic layer that opposes an end portion of said coil wiring pattern with said second ceramic layer or one of said first ceramic layers disposed in between; a connection wiring pattern that is arranged on the surface of said second ceramic layer and that connects together said external extension electrode connection pattern and said coil connection electrode; a first electrical conductor arranged on said first ceramic layer so as to extend there through in a thickness direction thereof and arranged to allow the end portions of said coil wiring pattern opposed to each first ceramic layer disposed in between to be electrically connected to each other and arranged to allow the coil wiring patterns to define said coil conductor; and a second electrical conductor arranged on said second ceramic layer and said first ceramic layer in contact with said second ceramic layer so as to extend therethrough in a thickness direction thereof and arranged to electrically connect the end portion of said coil wiring pattern and said coil connection electrode which are opposed to each other, said method comprising the steps of:

providing said plurality of first ceramic layers and forming said first electrical conductor or said second electrical conductor on the first ceramic layers;

forming said coil wiring pattern on said first ceramic layers;

providing said second ceramic layer and forming said second electrical conductor on the second ceramic layer;

forming said external extension electrode connection pattern, said coil connection electrode, and said connection wiring pattern on said second ceramic layer;

laminating said first and second ceramic layers in a state in which said second ceramic layer is inserted at the desired position in the laminate; and calcining said laminate; wherein in the step of forming said external extension electrode connection pattern, said coil connection electrode, and said connection wiring pattern in said second ceramic layer, said coil connection electrode is formed to have a configuration in which a surface portion of said second ceramic layer opposing with one of said first ceramic layers or said second ceramic layer disposed in between is connected to the end portion of said coil wiring pattern that opposes the coil connection electrode, and said connection wiring pattern is formed to have a configuration in which one portion of said coil connection electrode and one portion of said external extension electrode connection pattern are connected to each other.

2. The method of manufacturing the multilayered electronic component according to claim 1, wherein the step of forming said external extension electrode connection pattern, said coil connection electrode, and said connection wiring pattern on said second ceramic layer to define said coil connection electrode, includes the step of forming the coil connection electrode along a circulation trace of said coil conductor when viewed from a circulation center-line direction of said coil conductor.

3. The method of manufacturing the multilayered electronic component according to claim 1, wherein the step of forming said external extension electrode connection pattern, said coil connection electrode, and said connection wiring pattern on said second ceramic layer to define said coil connection electrode, includes the step of forming the coil connection electrode to have a substantially annular shape in which one end is open.

4. The method of manufacturing the multilayered electronic component according to claim 1, wherein the step of forming said external extension electrode connection pattern, said coil connection electrode, and said connection wiring pattern to define said coil connection electrode, includes the step of forming the coil connection electrode to have a land portion in a surface portion of respective ones of the first and second ceramic layers thereof.

5. The method of manufacturing the multilayered electronic component according to claim 4, wherein the step of forming said coil wiring pattern includes the step of forming the coil wiring pattern to have a shape in which a circulation trace of said coil conductor when viewed from a circulation center-line direction thereof has a substantially rectangular shape.

6. The method of manufacturing the multilayered electronic component according to claim 5, wherein the step of forming said coil wiring pattern on said first ceramic layer includes the step of forming said coil wiring pattern such that an end portion of said coil wiring pattern is positioned in a corner of said coil conductor having a circulation trace when viewed from a circulation center-line direction that is substantially rectangular.

7. The method according to claim 1, wherein an axis of said coil conductor is substantially parallel to a mounting surface of the multilayered electronic component.

8. The method according to claim 1, wherein the end portions of each of said coil wiring patterns are formed at a location that is in a middle of said coil conductor.

9. The method according to claim 1, wherein end portions of each of said coil wiring patterns, the coil connection electrode, and the external extension electrode connection pattern are formed to have a connection land configuration that is wider than remaining portions of each of said coil wiring patterns, the coil connection electrode, and the external extension electrode connection pattern.

10. The method according to claim 1, wherein the multilayered electronic component is one of an inductor, a high-frequency module, a multilayer chip impeder, a coupler, a balun, a delay line, a multilayered substrate, a, multilayer LC filter, a low-pass filter, a band-pass filter, a band elimination filter, a high-pass filter.

* * * * *